United States Patent
Wu et al.

(10) Patent No.: US 6,391,751 B1
(45) Date of Patent: May 21, 2002

(54) METHOD FOR FORMING VERTICAL PROFILE OF POLYSILICON GATE ELECTRODES

(75) Inventors: David Donggang Wu, Austin, TX (US); William R. Roche, Beaverton, OR (US); Scott D. Luning, Austin; Karen L. E. Turnqest, Pflugerville, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/626,668

(22) Filed: Jul. 27, 2000

(51) Int. Cl.[7] ............... H01L 2/3205; H01L 21/4763; H01L 21/425; H01L 21/336
(52) U.S. Cl. ............... 438/585; 438/299; 438/532
(58) Field of Search ............... 438/585, 299, 438/515, 516, 528, 529, 532

(56) References Cited

U.S. PATENT DOCUMENTS

| | | | | |
|---|---|---|---|---|
| 5,545,574 A | * | 8/1996 | Chen et al. | 437/40 |
| 5,899,732 A | * | 5/1999 | Gardner et al. | 438/473 |
| 6,037,204 A | * | 3/2000 | Chang et al. | 438/231 |
| 6,051,460 A | * | 4/2000 | Nayak et al. | 438/232 |
| 6,200,887 B1 | * | 3/2001 | Balasubramaniam et al. | 438/585 |
| 6,228,766 B1 | * | 5/2001 | Fujii | 438/682 |

* cited by examiner

Primary Examiner—John F. Niebling
Assistant Examiner—Walter L. Lindsay, Jr.
(74) Attorney, Agent, or Firm—Williams, Morgan & Amerson, P.C.

(57) ABSTRACT

The present invention is directed to a method of forming a semiconductor device. In one illustrative embodiment, the method comprises forming a layer of polysilicon, forming a masking layer above the layer of polysilicon, and patterning the masking layer to expose portions of the layer of polysilicon. The method further comprises implanting a dopant material into the exposed portions of the layer of polysilicon to convert the exposed portions of the layer of polysilicon to substantially amorphous silicon, and performing an etching process to remove the substantially amorphous silicon to define a gate electrode.

14 Claims, 3 Drawing Sheets

METHOD FOR FORMING VERTICAL PROFILE OF POLYSILICON GATE ELECTRODES

BACKGROUND OF THE INVENTION

1. Field of the Invention

This invention relates generally to semiconductor processing technology, and, more particularly, to a method of forming gate electrodes on semiconductor devices.

2. Description of the Related Art

There is a constant drive to reduce the channel length of transistors to increase the overall speed of the transistor, as well as integrated circuit devices incorporating such transistors. A conventional integrated circuit device, such as a microprocessor, is typically comprised of many thousands of semiconductor devices, e.g., transistors, formed above the surface of a semiconducting substrate. For the integrated circuit device to function, the transistors must be electrically connected to one another through conductive interconnections.

Many modem integrated circuit devices are very densely packed, i.e., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. The conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc. These conductive lines and plugs may be formed by a variety of known techniques, e.g., single damascene processing, dual damascene processing, etc.

As feature sizes have continued to decrease, minor variations in the size of various components may adversely impact the performance of the resulting semiconductor device. For example, in forming gate electrodes comprised of polycrystalline silicon (polysilicon), there may be variations or non-uniformity in the shape and configuration of the gate electrode. For example, the sidewalls of the gate electrode may not be as vertical as desired, e.g., there may be an outward flaring toward the bottom of the gate electrode. Additionally, the gate electrode may not be uniform along its width.

FIGS. 1A and 1B depict illustrative examples of non-uniform gate electrodes. As shown in these figures, the semiconductor device 50 is comprised of a gate dielectric 54 formed above a semiconducting substrate 52, and a gate electrode 56, with sidewalls 57, formed above the gate dielectric 54. FIG. 1A depicts the situation in which there is an undesirable outward flaring of the sidewalls 57 of the gate electrode toward the bottom of the gate electrode 56. FIG. 2B depicts the situation in which the sidewalls 57 of the gate electrode 56 are non-uniform and not as vertical as might be desired.

The non-uniformity of the profile of the gate electrode is due, at least in part, to the grain structure and grain size of the polysilicon gate electrode material, and the etching processes used to form the gate electrode. The problem has become even more problematic as the channel length of modem semiconductor devices becomes smaller and smaller. There are several problems that may arise from such non-uniform gate electrode profiles. For example, in the illustrative situation where the gate electrode is flared outward at the bottom, sidewall spacers that are formed adjacent the gate electrode to insulate the gate electrode from the source/drain regions of the transistor device may be insufficient to adequately insulate the gate electrode from the source/drain regions formed on the device. The flared bottom of the gate electrode also results in the source/drain extension doping implants and halo doping implants being more graded, which is undesirable in advanced CMOS devices. Additionally, if there are variations in the profile of the gate electrode in the width direction, then the electrical field set up when the transistor is turned "on" will vary along the width of the transistor.

The present invention is directed to a method for solving or at least reducing some or all of the aforementioned problems.

SUMMARY OF THE INVENTION

The present invention is directed to a method of forming a semiconductor device. In one illustrative embodiment, the method comprises forming a layer of polysilicon, forming a masking layer above the layer of polysilicon, and patterning the masking layer to expose portions of the layer of polysilicon. The method further comprises implanting a dopant material into the exposed portions of the layer of polysilicon to convert the exposed portions of the layer of polysilicon to substantially amorphous silicon, and performing an etching process to remove the substantially amorphous silicon to define a gate electrode.

BRIEF DESCRIPTION OF THE DRAWINGS

The invention may be understood by reference to the following description taken in conjunction with the accompanying drawings, in which like reference numerals identify like elements, and in which.

Figure 1A:
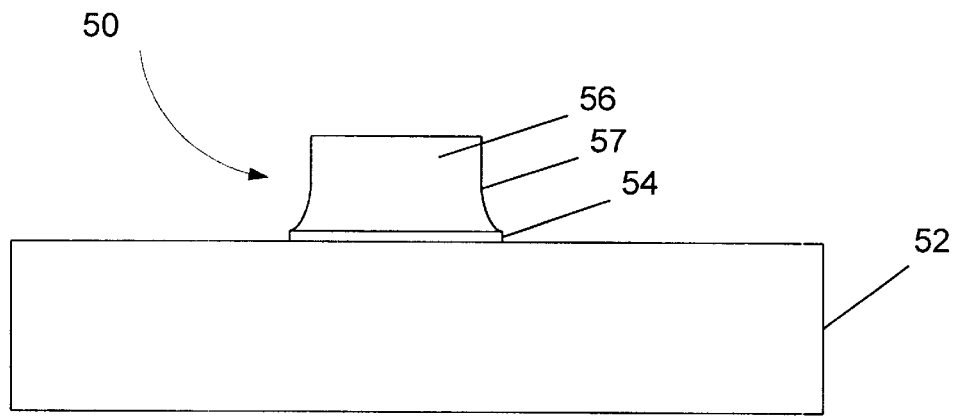
FIGS. 1A and 1B depict illustrative examples of gate electrodes formed using prior art techniques.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming polysilicon gate electrodes in a semiconductor device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 1B:
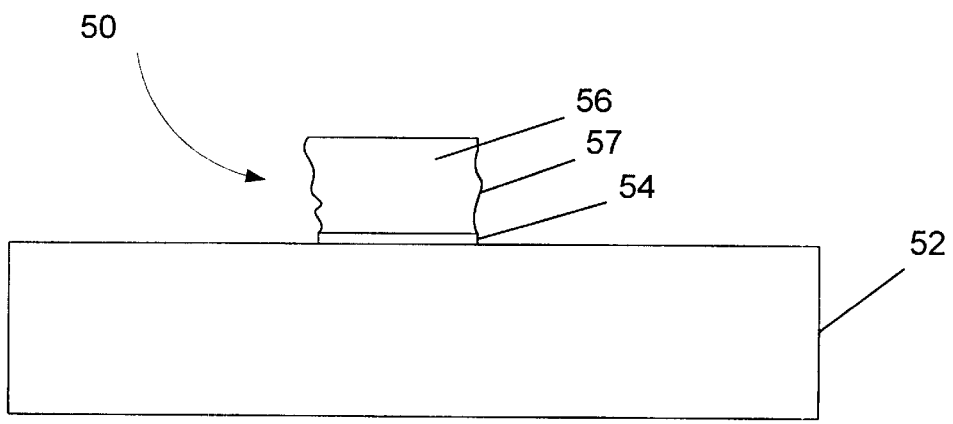
Figure 2:
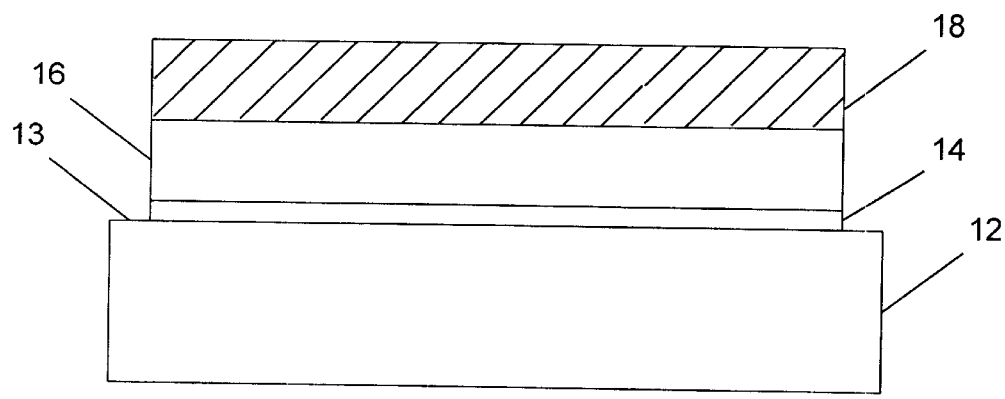
FIG. 2 is a cross-sectional view of a semiconducting substrate having a plurality of process layers formed thereon.

As shown in FIG. 2, a gate dielectric layer 14 is formed above a surface 13 of a semiconducting substrate 12, and a layer of polysilicon 16 is formed above the gate dielectric layer 14. Additionally, a layer of photoresist 18 is formed above the layer of polysilicon 16. The gate dielectric layer 14 and the layer of polysilicon 16 may be formed by a variety of known techniques, e.g., thermal growing, plasma enhanced chemical vapor deposition ("PECVD"), chemical vapor deposition ("CVD"), physical vapor deposition ("PVD"), sputtering, etc. The layer of photoresist 1I may be formed by a variety of techniques, such as spin-coating. Thus, the particular technique of forming the layers depicted in FIG. 1, as well as the particular materials of construction of those layers, should not be considered a limitation of the present invention unless specifically recited in the appended claims.

The gate dielectric layer 14 may be comprised of a variety of materials, such as silicon dioxide, silicon oxynitride, etc. In one illustrative embodiment, the gate dielectric layer 14 is comprised of a thermally grown layer of silicon dioxide having a thickness ranging from approximately 15–30 Å. Similarly, the layer of polysilicon 16 may be formed by a variety of techniques and to a variety of thicknesses. In one illustrative embodiment, the layer of polysilicon 16 is formed by a CVD process and has a thickness ranging from approximately 1000–2000 Å. The layer of photoresist 18 may be comprised of either a positive or negative photoresist, and it may be formed by a variety of techniques. In one illustrative example, the layer of photoresist 18 is approximately 5000–8000 Å thick and is formed by a spin-coating process.

Figure 3:
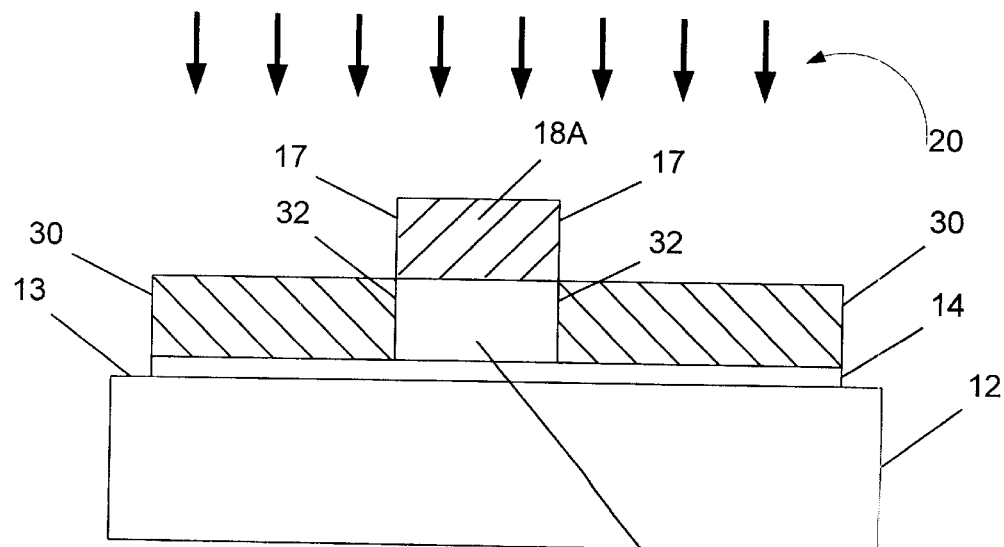
FIG. 3 is the device shown in FIG. 1 after the layer of photoresist has been patterned and an ion implantation process has been performed.

Next, as shown in FIG. 3, the layer of photoresist 18 is patterned to define a mask 18A that will be used in forming a gate electrode of the device. The layer of photoresist 18 may be patterned by known photolithographic processes. Thereafter, as indicated by arrows 20, an ion implantation process is performed on the structure depicted in FIG. 3. The purpose of the ion implantation process is to convert the portions of the layer of polysilicon 16 extending beyond sides 17 of the mask 18A to substantially amorphous silicon regions 30. This results in an interface 32 between the amorphous silicon regions 30 and a section 31 of the layer of polysilicon 16 under the photoresist mask 18A. Of course, other masking materials may be used in lieu of photoresist if desired.

During the ion implantation process, a variety of ions may be implanted into the layer of polysilicon 16. For example, ions such as germanium, silicon, nitrogen, etc. may be implanted at this time. The particular element selected for this process may be varied, but it should be one that will tend to convert the grain structure of the layer of polysilicon 16 to substantially amorphous silicon after the implantation process is performed. Of course, during this process, the conversion of the layer of polysilicon 16 to amorphous silicon may not be 100% complete. However, the dopant atoms, the dopant concentration and energy level of the ion implantation process should be such that the exposed portions of the polysilicon layer 16 beyond the mask 18A are converted to substantially amorphous silicon so as to define the interface 32 between polycrystalline silicon and the amorphous regions 30.

The concentration of the dopant atoms in the ion implantation process will vary depending upon the particular element selected. For example, in the case where germanium is selected as the dopant material, the concentration may range from $5 \times 10^{14} - 2 \times 10^{15}$ ions/cm$^2$. If silicon is selected as the dopant material, the concentration may range from $2 \times 10^{15} - 1 \times 10^{16}$ ions/cm$^2$. The concentration of other dopant materials may vary.

The energy level of the ion implantation process will also vary depending upon the particular element selected for implanting, as well as the thickness of the layer of polysilicon 16. For example, the energy level may range from 50–160 keV. In the illustrative example where the layer of polysilicon 16 is approximately 1000–2000 Å thick, and germanium at a concentration of approximately $5 \times 10^{14}$ ions/cm$^2$ is implanted into the layer of polysilicon 16, the energy level will range from approximately 80–160 keV. If silicon is selected as the dopant material, the concentration may range from approximately $2 \times 10^{15} - 1 \times 10^{16}$ ions/cm$^2$, and it may be implanted at an energy ranging from approximately 50–100 keV.

Figure 4:
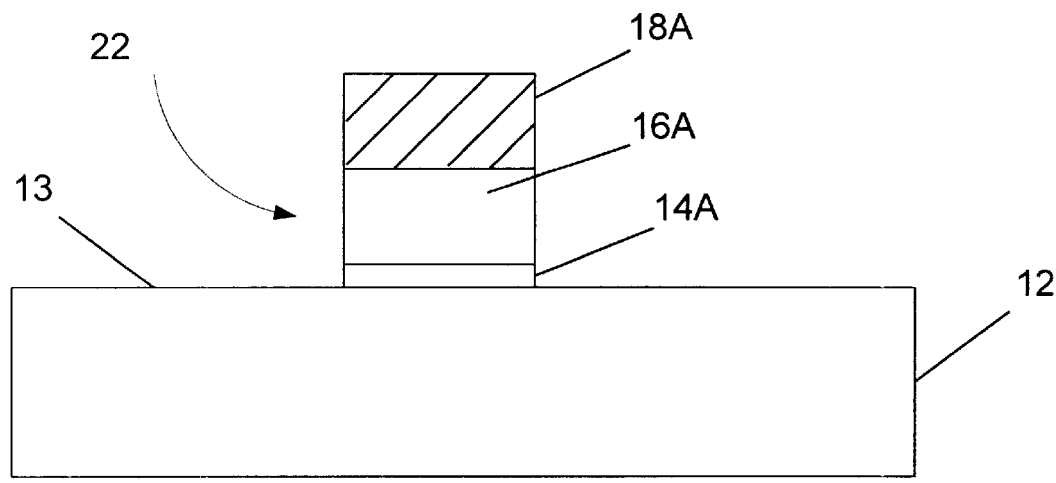
FIG. 4 is the device depicted in FIG. 2 after an etching process has been performed to define a gate stack.

Next, as shown in FIG. 4, one or more etching processes may be used to define a gate stack 22 comprised of a gate electrode 16A and gate dielectric layer 14A. The particular etching process used may be varied as a matter of design choice. In one illustrative embodiment, the etching process used to define the gate stack 22 is an anisotropic etching process.

Figure 5:
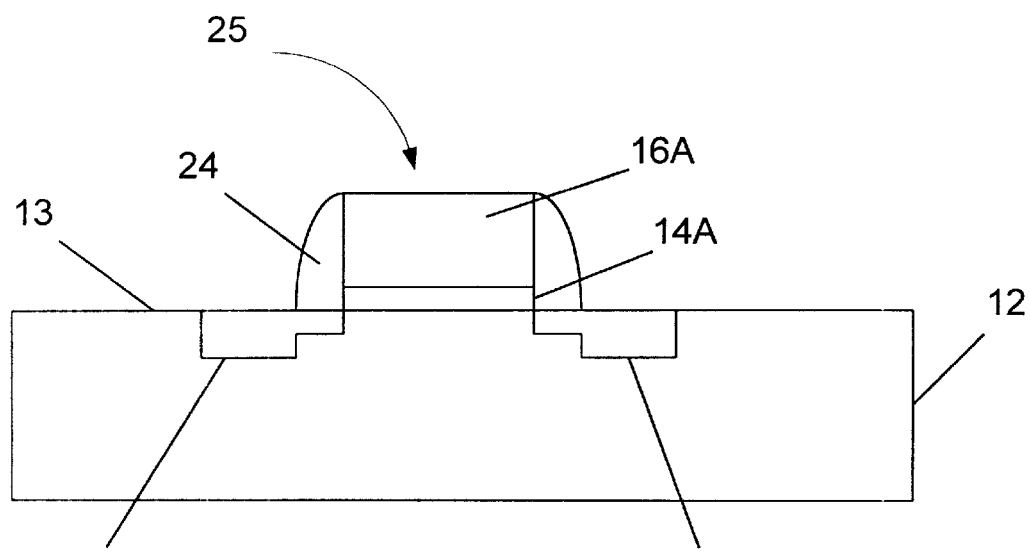
FIG. 5 is an illustrative semiconductor device formed in accordance with one illustrative embodiment of the present invention.

Thereafter, subsequent processing operations are performed to complete the formation of the semiconductor device. For example, as shown in FIG. 5, a transistor 25 may be further comprised of a plurality of sidewall spacers 24 and a plurality of source/drain regions 26 formed in the substrate 12. The particular methods and materials of construction for these other components are well known to those skilled in the art and will not be repeated herein.

Through use of the present invention, a gate electrode of a semiconductor device may be formed that is more vertically uniform in cross-section as compared to gate electrodes formed using prior art methods (see, e.g., the gate electrodes depicted in FIGS. (1A–1B), thereby eliminating some of the problems mentioned in the background section of this application. As a result, a device may be formed with more uniform characteristics that may enhance device performance as compared to prior art devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a layer of polysilicon;

forming a masking layer above said layer of polysilicon;

patterning said masking layer to expose portions of said layer of polysilicon;

implanting a dopant material into said exposed portions of the layer of polysilicon to convert the exposed portions of the layer of polysilicon to substantially amorphous silicon; and performing an etching process to remove said substantially amorphous silicon to define a gate electrode.

2. The method of claim 1, wherein forming a layer of polysilicon comprises depositing a layer of polysilicon.

3. The method of claim 1, wherein forming a masking layer above said layer of polysilicon comprises spin-coating a masking layer comprised of photoresist above said layer of polysilicon.

4. The method of claim 1, wherein implanting a dopant material into said exposed portions of the layer of polysilicon to convert the exposed portions of the layer of polysilicon to substantially amorphous silicon comprises implanting a dopant material comprised of at least one of germanium, silicon and nitrogen into said exposed portions of the layer of polysilicon to convert the exposed portions of the layer of polysilicon to substantially amorphous silicon.

5. The method of claim 1, wherein implanting a dopant material into said exposed portions of the layer of polysilicon to convert the exposed portions of the layer of polysilicon to substantially amorphous silicon comprises implanting a dopant material into said exposed portions of the layer of polysilicon at an energy level ranging from approximately 50–160 keV to convert the exposed portions of the layer of polysilicon to substantially amorphous silicon.

6. The method of claim 1, wherein implanting a dopant material into said exposed portions of the layer of polysilicon to convert the exposed portions of the layer of polysilicon to substantially amorphous silicon comprises implanting a dopant material at a concentration ranging from approximately $5\times10^{14}$–$1\times10^{16}$ ions/cm$^2$ into said exposed portions of the layer of polysilicon to convert the exposed portions of the layer of polysilicon to substantially amorphous silicon.

7. The method of claim 1, wherein implanting a dopant material into said exposed portions of the layer of polysilicon to convert the exposed portions of the layer of polysilicon to substantially amorphous silicon comprises implanting a dopant material comprised of germanium at a concentration ranging from approximately $5\times10^{14}$–$2\times10^{15}$ ions/cm$^2$ into said exposed portions of the layer of polysilicon to convert the exposed portions of the layer of polysilicon to substantially amorphous silicon.

8. The method of claim 1, wherein implanting a dopant material into said exposed portions of the layer of polysilicon to convert the exposed portions of the layer of polysilicon to substantially amorphous silicon comprises implanting a dopant material comprised of silicon at a concentration ranging from approximately $2\times10^{15}$–$1\times10^{16}$ ions/cm$^2$ into said exposed portions of the layer of polysilicon to convert the exposed portions of the layer of polysilicon to substantially amorphous silicon.

9. The method of claim 1, wherein implanting a dopant material into said exposed portions of the layer of polysilicon to convert the exposed portions of the layer of polysilicon to substantially amorphous silicon comprises implanting a dopant material comprised of germanium at a concentration ranging from approximately $5\times10^{14}$–$2\times10^{15}$ ions/cm$^2$ and at an energy level ranging from approximately 50–160 keV into said exposed portions of the layer of polysilicon to convert the exposed portions of the layer of polysilicon to substantially amorphous silicon.

10. The method of claim 1, wherein implanting a dopant material into said exposed portions of the layer of polysilicon to convert the exposed portions of the layer of polysilicon to substantially amorphous silicon comprises implanting a dopant material comprised of silicon at a concentration ranging from approximately $2\times10^{15}$–$1\times10^{16}$ ions/cm$^2$ and at an energy level ranging from approximately 50–100 keV into said exposed portions of the layer of polysilicon to convert the exposed portions of the layer of polysilicon to substantially amorphous silicon.

11. A method, comprising:

depositing a layer of polysilicon;

forming a layer of photoresist above said layer of polysilicon;

patterning said layer of photoresist to expose portions of said layer of polysilicon;

implanting a dopant material comprised of at least one of germanium, silicon and nitrogen into said exposed portions of the layer of polysilicon to convert the exposed portions of the layer of polysilicon to substantially amorphous silicon; and performing an etching process to remove said substantially amorphous silicon to define a gate electrode.

12. The method of claim 11, wherein forming a layer of photoresist above said layer of polysilicon comprises spin-coating a layer of photoresist above said layer of polysilicon.

13. The method of claim 11, wherein implanting a dopant material comprised of at least one of germanium, silicon and nitrogen into said exposed portions of the layer of polysilicon to convert the exposed portions of the layer of polysilicon to substantially amorphous silicon comprises implanting a dopant material comprised of at least one of germanium, silicon and nitrogen into said exposed portions of the layer of polysilicon at an energy level ranging from approximately 50–160 keV to convert the exposed portions of the layer of polysilicon to substantially amorphous silicon.

14. The method of claim 11, wherein implanting a dopant material comprised of at least one of germanium, silicon and nitrogen into said exposed portions of the layer of polysilicon to convert the exposed portions of the layer of polysilicon to substantially amorphous silicon comprises implanting a dopant material comprised of at least one of germanium, silicon and nitrogen at a concentration ranging from approximately $5\times10^{14}$–$1\times10^{16}$ ions/cm$^2$ into said exposed portions of the layer of polysilicon to convert the exposed portions of the layer of polysilicon to substantially amorphous silicon.

* * * * *